(12) United States Patent
Anderson et al.

(10) Patent No.: US 10,896,972 B2
(45) Date of Patent: Jan. 19, 2021

(54) SELF-ALIGNED CONTACT FOR VERTICAL FIELD EFFECT TRANSISTOR

(71) Applicant: International Business Machines Corporation, Armonk, NY (US)

(72) Inventors: Brent A. Anderson, Jericho, VA (US); Steven Bentley, Menands, NY (US); Su Chen Fan, Cohoes, NY (US); Balasubramanian Pranatharthiharan, Watervliet, NY (US); Junli Wang, Slingerlands, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/655,589

(22) Filed: Oct. 17, 2019

(65) Prior Publication Data

US 2020/0052096 A1 Feb. 13, 2020

Related U.S. Application Data

(62) Division of application No. 15/599,878, filed on May 19, 2017.

(51) Int. Cl.
*H01L 29/78* (2006.01)
*H01L 29/66* (2006.01)
(Continued)

(52) U.S. Cl.
CPC .... *H01L 29/66666* (2013.01); *H01L 29/0847* (2013.01); *H01L 29/1037* (2013.01);
(Continued)

(58) Field of Classification Search
CPC ............. H01L 29/6656; H01L 29/7827; H01L 29/665; H01L 29/1037; H01L 29/6666;
(Continued)

(56) References Cited

U.S. PATENT DOCUMENTS 7,176,089 B2 2/2007 Furukawa et al.
7,683,428 B2 3/2010 Chidambarrao et al.
(Continued)

FOREIGN PATENT DOCUMENTS

GB 2338596 A 12/1999
KR 20100052814 A 5/2010

OTHER PUBLICATIONS

List of IBM Patents or Patent Applications Treated as Related; Date Filed: Oct. 17, 2019 2 pages.

*Primary Examiner* — Hoa B Trinh
(74) *Attorney, Agent, or Firm* — Cantor Colburn LLP; Joseph Petrokaitis

(57) ABSTRACT

Embodiments of the invention are directed to a method and resulting structures for a semiconductor device having self-aligned contacts. In a non-limiting embodiment of the invention, a semiconductor fin is formed vertically extending from a bottom source/drain region of a substrate. A conductive gate is formed over a channel region of the semiconductor fin. A top source/drain region is formed on a surface of the semiconductor fin and a top metallization layer is formed on the top source/drain region. A dielectric cap is formed over the top metallization layer.

8 Claims, 16 Drawing Sheets

(51) Int. Cl.
*H01L 29/417* (2006.01)
*H01L 29/08* (2006.01)
*H01L 29/10* (2006.01)

(52) U.S. Cl.
CPC .... *H01L 29/41741* (2013.01); *H01L 29/6656* (2013.01); *H01L 29/7827* (2013.01); *H01L 29/665* (2013.01)

(58) Field of Classification Search
CPC ......... H01L 29/66795; H01L 29/66742; H01L 29/66712
See application file for complete search history.

(56) References Cited

U.S. PATENT DOCUMENTS

| | | | |
|---|---|---|---|
| 8,471,296 B2 * | 6/2013 | Cheng | H01L 23/5256 257/209 |
| 8,809,836 B2 | 8/2014 | Pillarisetty et al. | |
| 9,064,801 B1 | 6/2015 | Horak et al. | |
| 9,312,383 B1 | 4/2016 | Cheng et al. | |
| 9,356,155 B2 | 5/2016 | Sandhu | |
| 9,490,257 B2 | 11/2016 | Arnold | |
| 9,754,875 B1 * | 9/2017 | Fogel | H01L 23/5256 |
| 9,780,208 B1 * | 10/2017 | Xie | H01L 21/324 |
| 2013/0126980 A1 | 5/2013 | Baars et al. | |
| 2017/0358660 A1 | 12/2017 | Cheng et al. | |
| 2018/0233502 A1 | 8/2018 | Balakrishnan et al. | |
| 2018/0337256 A1 | 11/2018 | Anderson et al. | |

\* cited by examiner

SELF-ALIGNED CONTACT FOR VERTICAL FIELD EFFECT TRANSISTOR

DOMESTIC PRIORITY

This application is a divisional of U.S. patent application Ser. No. 15/599,878, filed May 19, 2017, the disclosure of which is incorporated by reference herein in its entirety.

BACKGROUND

The present invention generally relates to fabrication methods and resulting structures for semiconductor devices. More specifically, the present invention relates to vertical field effect transistors (VFETs) with self-aligned contacts.

Field effect transistors (FETs) have been known for a number of years and are now the transistor of choice for use in complex integrated digital circuits. In general, field effect transistors can be fabricated somewhat more simply and with larger process windows than bipolar transistors and, additionally, allow simplified circuit and device design. As demands for higher digital switching performance have increased, as well as demands for increased functionality and economy of manufacture, constraints on transistor footprint size (and, hence, current-carrying capacity) have also increased.

Traditional CMOS (complementary metal oxide semiconductor) fabrication techniques include process flows for constructing planar transistors. With planar transistors, transistor density can be increased by decreasing the pitch between transistor gate elements. However, with planar transistors, the ability to decrease gate pitch is limited by the required gate length and spacer thickness. In recent years, there has been significant research and development with regard to nonplanar transistor architectures. Some nonplanar transistor architectures, such as VFETs, employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin or nanowire extends upward from the substrate surface. The fin or nanowire forms the channel region of the transistor. A source region and a drain region are situated in electrical contact with the top and bottom ends of the channel region, while the gate is disposed on one or more of the fin or nanowire sidewalls.

Decoupling the gate length from the gate pitch greatly improves the scaling of transistor density. With VFETs device scaling is determined by how closely conductive via contacts can be placed to source/drain and gate regions of the transistor. Unlike planar transistors, however, where self-aligned contact processes (which determine the spacing between source/drain contacts and a gate electrode) can be used, there are no known techniques for forming self-aligned contacts for VFETs. Consequently, the bottom source/drain contact-to-fin and gate contact-to-fin spacing requirements have not scaled at the same rate as other VFET features. These spacing requirements represent an area penalty that severely restricts the overall scaling factor of the VFET architecture. Reducing this area penalty and improving the scaling of these aspects of the VFET architecture is critical to achieve an overall scaling factor sufficient to enable sub-5 nm VFETs.

SUMMARY

The current invention is directed to systems and methods for forming a VFET having self-aligned contacts. In a non-limiting example embodiment of the invention, the top source/drain metallization layer of a conventional VFET is recessed and a dielectric cap is formed over the recessed layer. Contacts are then formed over the dielectric cap. The dielectric cap prevents a short between the contacts and the metallization layer, allowing for the bottom source/drain contact-to-fin spacing and the gate contact-to-fin spacing to be reduced.

Embodiments of the present invention are directed to a method for fabricating a semiconductor device having self-aligned contacts. A non-limiting example of the method includes forming a semiconductor fin vertically extending from a bottom source/drain region of a substrate. A conductive gate is formed over a channel region of the semiconductor fin and a top source/drain region is formed on a surface of the semiconductor fin. A top metallization layer is formed on the top source/drain region and a dielectric cap is formed over the top metallization layer. The dielectric cap allows for a bottom source/drain contact and a gate contact to self-align. Consequently, the dielectric cap provides the technical benefit of a VFET architecture having reduced contact-to-fin spacing requirements.

Embodiments of the present invention are directed to a method for fabricating a vertical field effect transistor having self-aligned contacts. A non-limiting example of the method includes forming a semiconductor fin vertically extending from a bottom source/drain region of a substrate. A conductive gate is formed over a channel region of the semiconductor fin. A top spacer is formed on the conductive gate and adjacent to sidewalls of the semiconductor fin. A dielectric liner is formed on the bottom source/drain region, the conductive gate, and sidewalls of the top spacer and an interlayer dielectric is formed over the dielectric liner. A top source/drain region is formed on a surface of the semiconductor fin and a top metallization layer is formed on the top source/drain region. The top metallization layer is recessed below a surface of the top spacer and a dielectric cap is formed over the recessed top metallization layer such that a portion of the dielectric cap extends over the dielectric liner and the interlayer dielectric. The dielectric cap allows for a bottom source/drain contact and a gate contact to self-align. Consequently, the dielectric cap provides the technical benefit of a VFET architecture having reduced contact to fin spacing requirements.

Embodiments of the invention are directed to semiconductor device. A non-limiting example of the semiconductor device includes a semiconductor fin vertically extending from a bottom source/drain region of a substrate and a conductive gate formed over a channel region of the semiconductor fin. A top source/drain region is formed on a surface of the semiconductor fin and a top metallization layer is formed on the top source/drain region. A dielectric cap is formed over the top metallization layer. The dielectric cap allows for a bottom source/drain contact and a gate contact to self-align. Consequently, the dielectric cap provides the technical benefit of a VFET architecture having reduced contact to fin spacing requirements.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
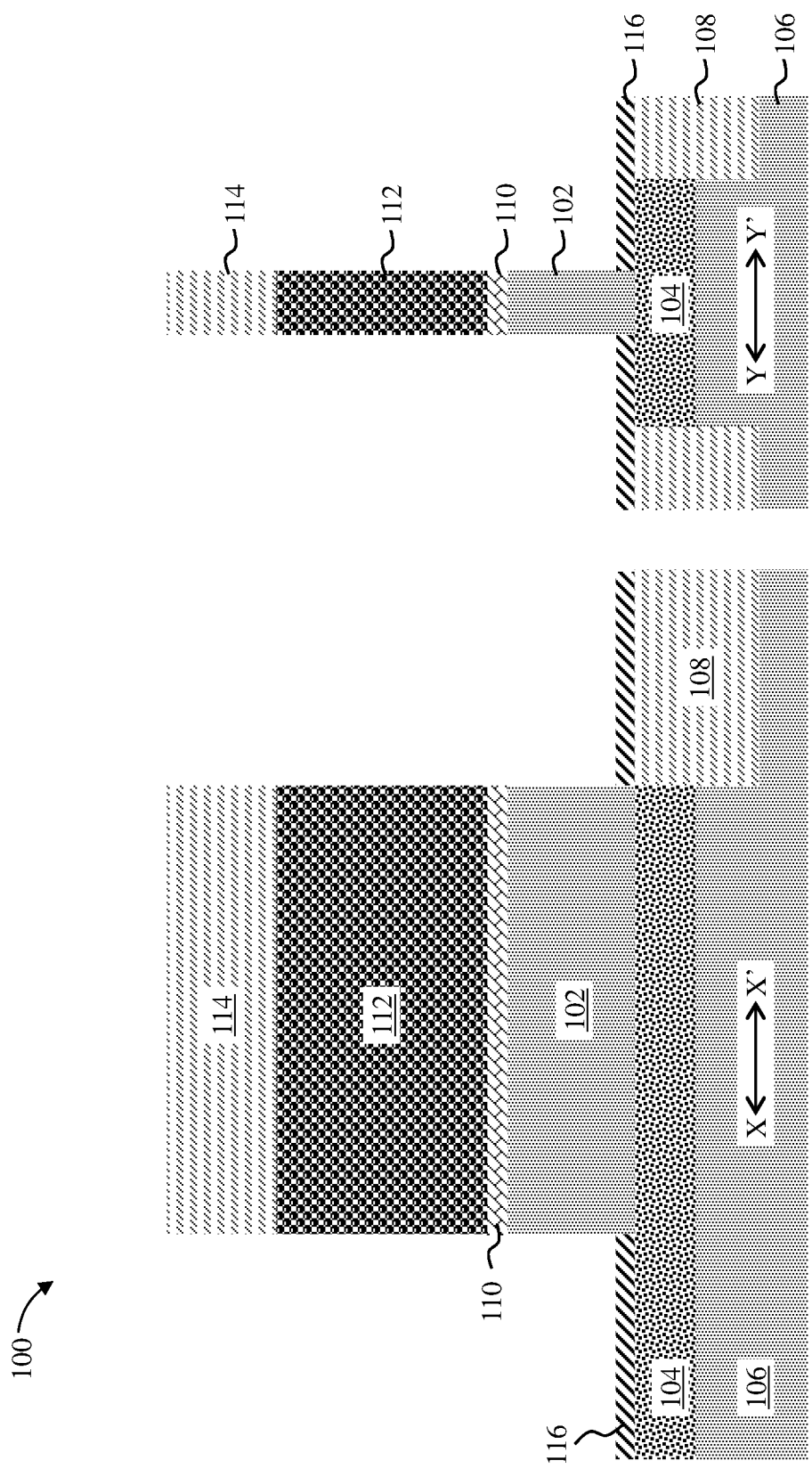
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. There are challenges, however, in scaling VFETs beyond the 7 nm node. One such challenge is the difficulty in further scaling some features of the conventional VFET architecture that have not kept pace with the scaling factor of the overall device, such as the bottom source/drain (S/D) contact-to-fin spacing and the gate contact-to-fin spacing. Improving the scaling of these aspects of the VFET architecture is critical to achieve an overall scaling factor sufficient to enable sub-5 nm VFETs. Conventional VFET fabrication schemes, however, do not support self-aligned contacts, and consequently, the bottom S/D contact and the gate contact must be formed far away from the fin to prevent shorting. These spacing requirements represent an area penalty that severely restricts the overall scaling factor of the VFET architecture.

Turning now to an overview of aspects of the present invention, one or more embodiments of the invention provide methods for forming a VFET and VFET structures having self-aligned contacts. A conventional VFET having a vertical fin, top and bottom source/drain regions, and a gate is formed on a substrate. A top source/drain metallization layer is formed on the top source/drain region. The top source/drain metallization layer is recessed and a dielectric cap is formed over the recessed layer. Contacts are formed over the dielectric cap. The dielectric cap prevents a short between the contacts and the metallization layer, greatly relaxing the contact process window. In this manner the bottom S/D contact and the gate contact are self-aligned to the cap and the bottom S/D contact-to-fin spacing requirement and gate contact-to-fin spacing requirement can be reduced. Moreover, recessing the top S/D metallization allows for the top S/D contact to be smaller than the fin, reducing the top S/D contact feature size. Consequently, conventional VFET contact spacing requirements are bypassed and the overall scaling factor of the VFET is improved.

Turning now to a more detailed description of aspects of the present invention, FIG. 1 depicts a cross-sectional view of a VFET structure 100 along a direction X-X' (parallel to fin direction) and Y-Y' (perpendicular to fin direction) during an intermediate operation of a method of fabricating a semiconductor device according to one or more embodiments of the invention. As depicted in FIG. 1, a partially fabricated semiconductor device can include one or more vertical semiconductor fins 102 (hereinafter semiconductor fins 102) formed on a bottom S/D region 104 of a substrate 106b. Each of the semiconductor fins 102 can have a height ranging from 1 nm to 150 nm, for example, from 10 nm to 50 nm. Each of the semiconductor fins 102 can have a width ranging from 5 nm to 40 nm, for example, from 10 nm to 20 nm. Adjacent semiconductor fins 102 can be separated by a pitch ranging from 20 nm to 100 nm, for example, from 30 nm to 50 nm.

The substrate 106 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 106 includes a buried oxide layer (not depicted). The semiconductor fins 102 can be electrically isolated from other regions of the substrate 106 by a shallow trench isolation (STI) 108. The STI 108 can be of any suitable dielectric material, such as, for example, a silicon oxide. Any known manner of forming the STI 108 can be utilized. In some embodiments of the invention, the STI 108 is formed by etching back the substrate 106 to form a trench, filling the trench with the STI 108 material, and planarizing to a surface of the substrate 106 using, for example, a CMP process.

The bottom S/D region 104 can be a source or drain region formed in the substrate 106 by a variety of methods, such as, for example, in-situ doped epitaxy, doped following the epitaxy, or by implantation and plasma doping. The bottom S/D region 104 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the invention, the bottom S/D region 104 includes epitaxial semiconductor materials grown from gaseous or liquid precursors. In some embodiments of the invention, epitaxial regions are epitaxially grown over the substrate 106. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, $BF_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 6:
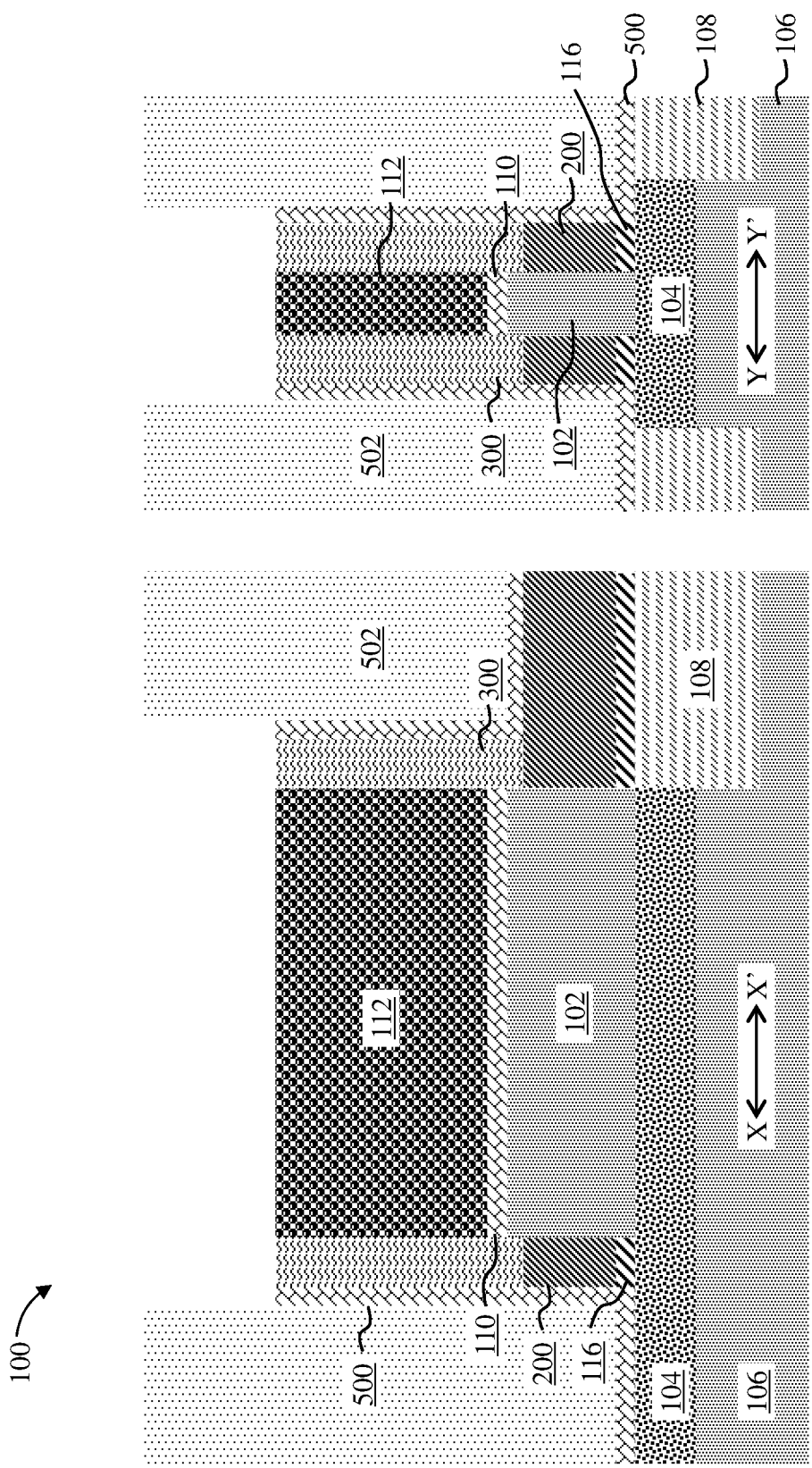
FIG. 6 depicts a cross-sectional view of the semiconductor structure after a processing operation according to one or more embodiments of the invention.
Figure 7:
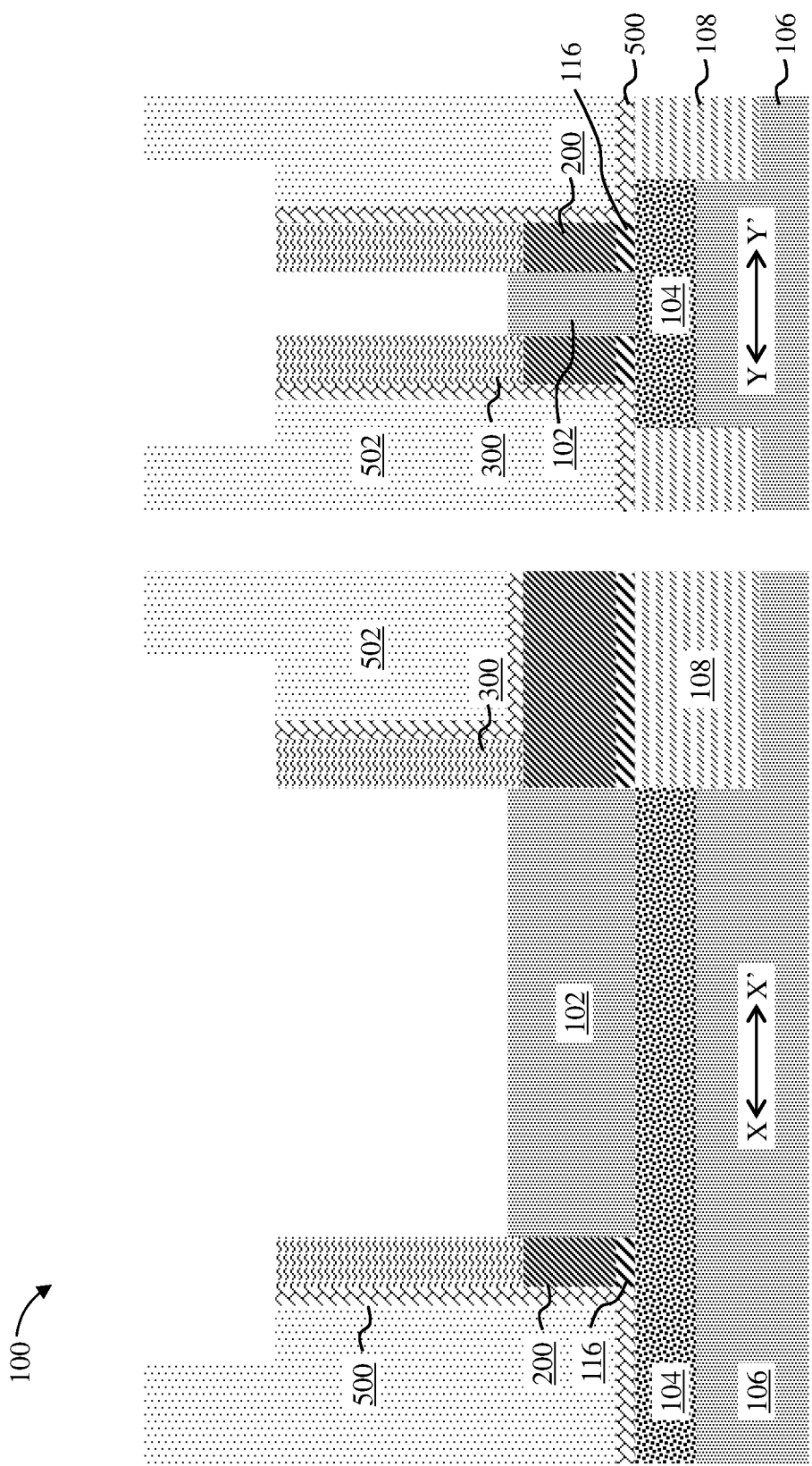
FIG. 7 depicts a cross-sectional view of the semiconductor structure after a processing operation according to one or more embodiments of the invention.
Figure 8:
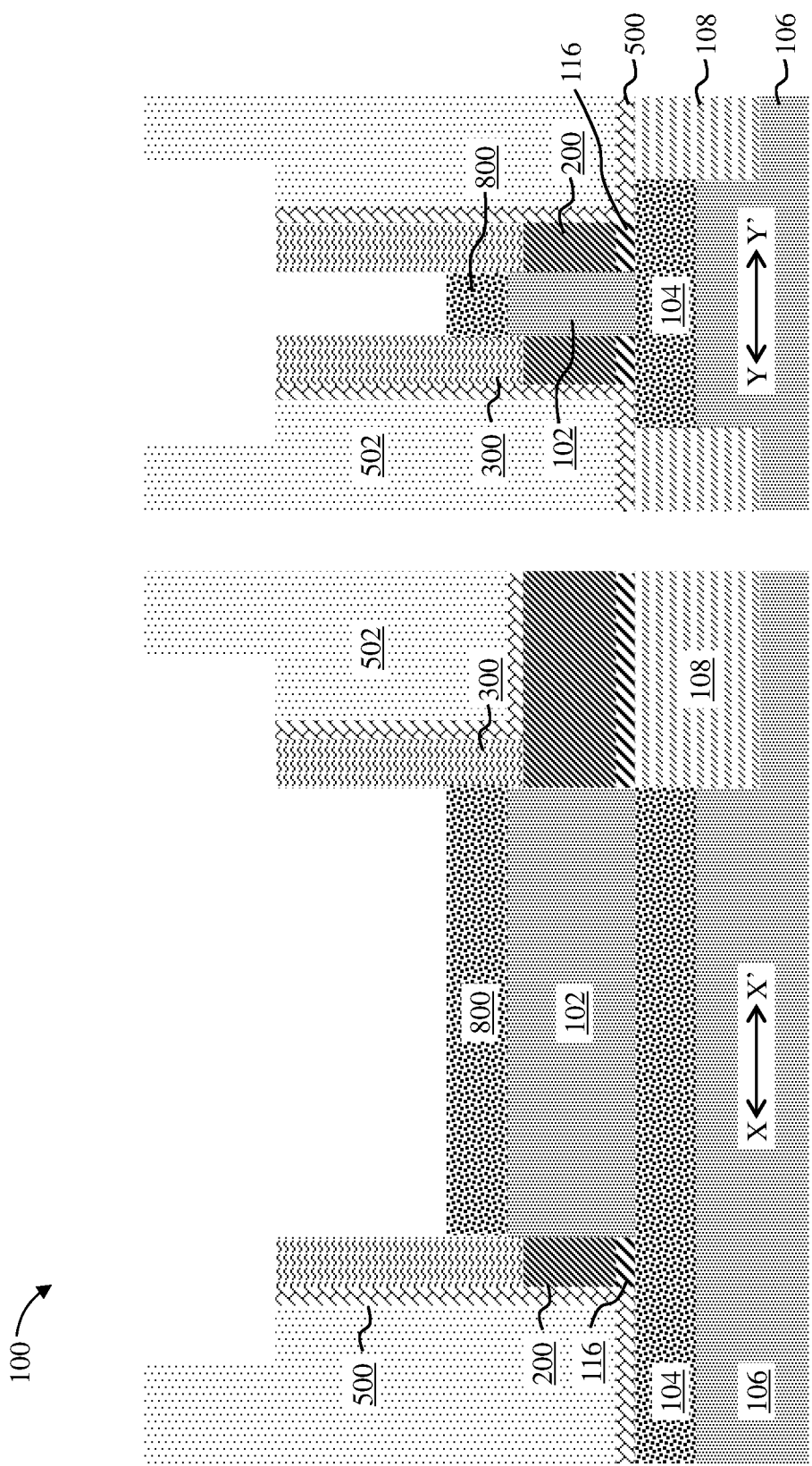
FIG. 8 depicts a cross-sectional view of the semiconductor structure after a processing operation according to one or more embodiments of the invention.

A tri-layer hard mask including a first hard mask 110, a second hard mask 112, and a third hard mask 114 is formed on a surface of each of the semiconductor fins 102. In some embodiments of the invention, the first hard mask 110 includes an oxide, such as, for example, $SiO_2$. In some embodiments of the invention, the second hard mask 112 includes amorphous silicon (a-Si). In some embodiments of the invention, the third hard mask 114 includes a nitride, such as, for example, silicon nitride. The tri-layer hard mask allows for a series of selective etches (as depicted in FIGS. 6 and 7) when exposing the semiconductor fins 102 prior to forming the top S/D region 800 (as depicted in FIG. 8).

The first, second, and third hard masks 110, 112, and 114 can be formed utilizing a deposition process such as, for example, CVD, plasma enhanced chemical vapor deposition (PECVD), chemical solution deposition, evaporation. In some embodiments of the invention, the first, second, and third hard masks 110, 112, and 114 are formed by a thermal process such as, for example, oxidation or nitridation. Any combination of the above mentioned processes can also be used in forming the first, second, and third hard masks 110, 112, and 114. The first, second, and third hard masks 110, 112, and 114 can each have a thickness from 5 nm to 150 nm, for example, from 30 nm to 60 nm.

A bottom spacer 116 is formed on the bottom S/D region 104, substrate 106, and STI 108. The bottom spacer 116 can include a dielectric material, such as silicon oxide, silicon nitride, silicon oxynitride, or a combination thereof, and can be formed using known deposition processes. In some embodiments of the invention, the bottom spacer 116 is formed by performing a directional deposition process such as, for example, a Gas Cluster Ion Beam (GCIB) process. The GCIB process is a deposition process that can be highly directional in nature. For example, the directional deposition process can result in the deposition of dielectric material on the horizontally oriented surfaces of the device, such as the upper surface of the substrate 106, while avoiding deposition of any substantial amount of dielectric material on the vertically-oriented surfaces of the device, such as sidewalls of the semiconductor fins 102.

Figure 2:
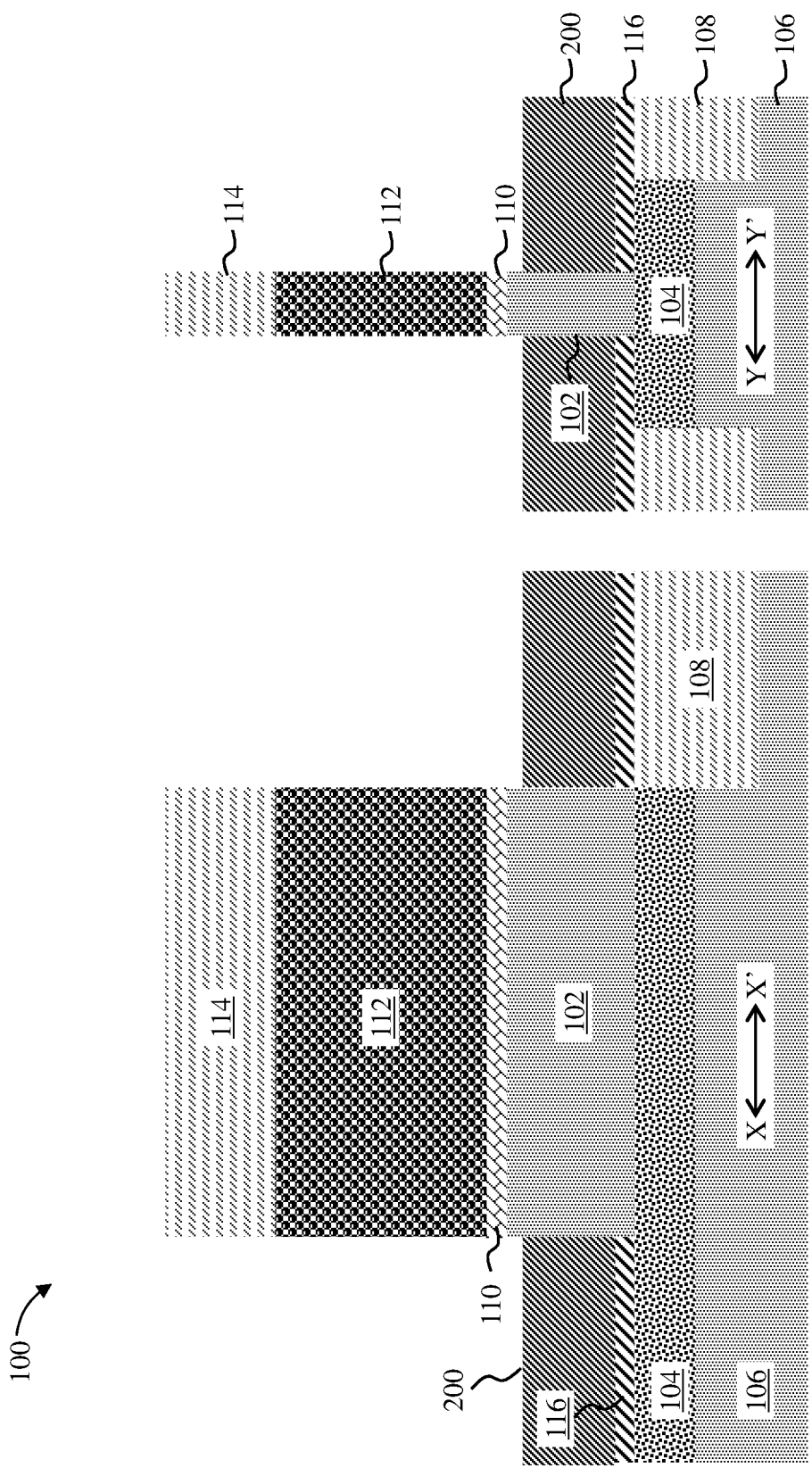
FIG. 2 depicts a cross-sectional view of the semiconductor structure after a processing operation according to one or more embodiments of the invention.

FIG. 2 depicts a cross-sectional view of the VFET structure 100 along X-X' and Y-Y' after forming a conductive gate 200 during an intermediate operation of the exemplary method of fabricating a semiconductor device according to one or more embodiments of the invention. As depicted in FIG. 2, the conductive gate 200 can be formed by, for example, deposition on a surface of the bottom spacer 116 and over channel regions (i.e., sidewalls) of the semiconductor fins 102. In some embodiments of the invention, the conductive gate 200 is overfilled above a surface of the semiconductor fins 102. In some embodiments of the invention, the conductive gate 200 is recessed below a surface of the semiconductor fins 102. In some embodiments of the invention, portions of the conductive gate 200 in non-channel regions of the VFET structure 100 are further recessed via, e.g., chamfering, to reduce gate resistance and parasitic capacitance.

In some embodiments of the invention, the conductive gate 200 can be a high-k metal gate (HKMG) and can include, for example, one or more gate dielectric materials, one or more work function metals (WFM), and one or more metal gate conductor materials. The gate dielectric material (not depicted) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The gate dielectric material can be formed by suitable deposition processes, for example, CVD, PECVD, atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal (not depicted) can be disposed over the gate dielectric material. The type of work function metal depends on the type of transistor and can differ between the nFET and pFET devices. Non-limiting examples of suitable work function metals include p-type work function metals and n-type work function metals. P-type work function metals include compositions such as ruthenium, palladium, platinum, cobalt, nickel, and conductive metal oxides, or any combination thereof. N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal can be deposited by a suitable deposition process, for example, CVD, PECVD, PVD, plating, thermal or e-beam evaporation, and sputtering.

The gate conductor material (not depicted) is deposited over the gate dielectric material and work function metal to form the HKMG. Non-limiting examples of suitable conductive metals include aluminum (Al), platinum (Pt), gold (Au), tungsten (W), titanium (Ti), or any combination thereof. The gate conductor material can be deposited by a suitable deposition process, for example, CVD, PECVD, PVD, plating, thermal or e-beam evaporation, and sputtering.

Figure 3:
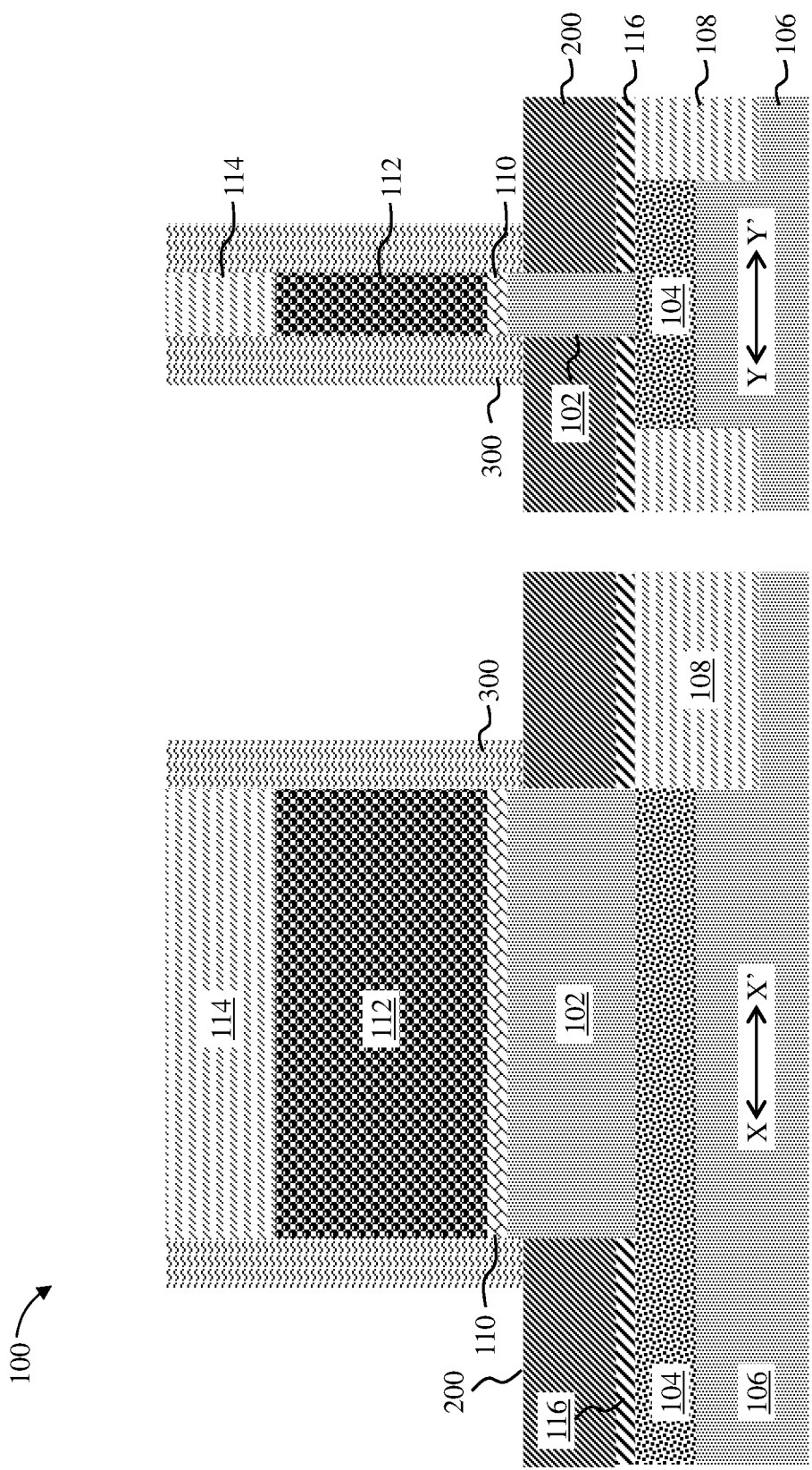
FIG. 3 depicts a cross-sectional view of the semiconductor structure after a processing operation according to one or more embodiments of the invention.

FIG. 3 depicts a cross-sectional view of the VFET structure 100 along X-X' and Y-Y' after forming a top spacer 300 during an intermediate operation of the exemplary method of fabricating a semiconductor device according to one or more embodiments of the invention. The top spacer 300 can be formed over the conductive gate 200 and on sidewalls of the semiconductor fins 102 and the first, second, and third hard masks 110, 112, and 114. The top spacer 300 can include a dielectric material, such as silicon oxide, silicon nitride, silicon oxynitride, or a combination thereof, and can be formed using known deposition processes. In some embodiments of the invention, the top spacer 300 can include a same material as the third hard mask 114.

Figure 4:
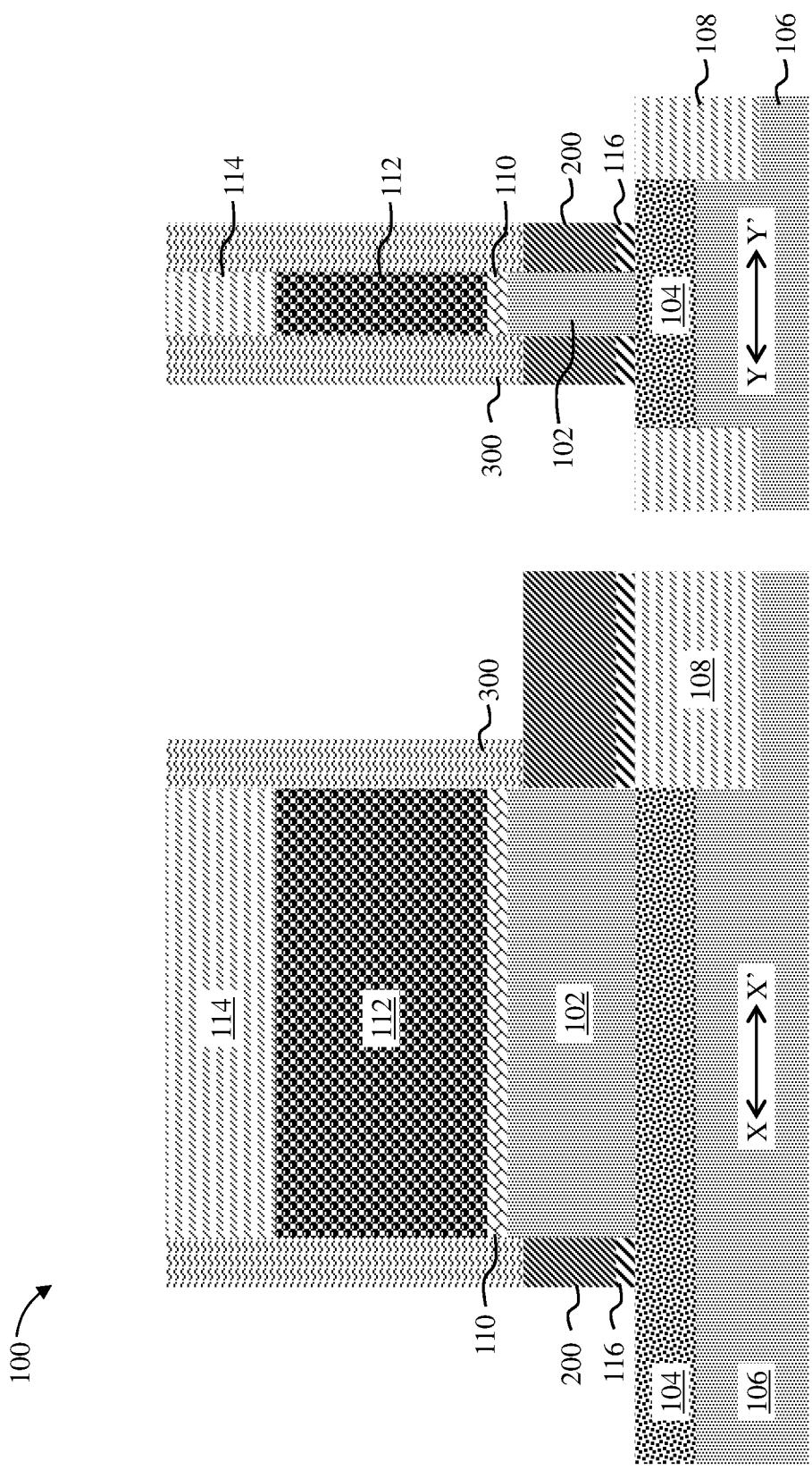
FIG. 4 depicts a cross-sectional view of the semiconductor structure after a processing operation according to one or more embodiments of the invention.

FIG. 4 depicts a cross-sectional view of the VFET structure 100 along X-X' and Y-Y' after patterning the conductive gate 200 during an intermediate operation of the exemplary method of fabricating a semiconductor device according to one or more embodiments of the invention. As depicted in FIG. 4, the conductive gate 200 is patterned by removing portions of the conductive gate 200 and the bottom spacer 116 to expose a surface of the substrate 106 and a surface of the bottom S/D region 104. The conductive gate 200 can be patterned by any lithographic process or etching methodology, such as, for example, a wet etch, a dry etch, or a combination of sequential wet and/or dry etches. The lithographic process can include applying a photoresist (not depicted) over the conductive gate 200, exposing portions of the photoresist to a desired pattern of radiation, and developing the exposed portions of photoresist. The pattern can then be transferred to the conductive gate 200 using, for example, RIE. In some embodiments of the invention, the conductive gate 200 is patterned using RIE selective to the top spacer 300 and/or the substrate 106.

Figure 5:
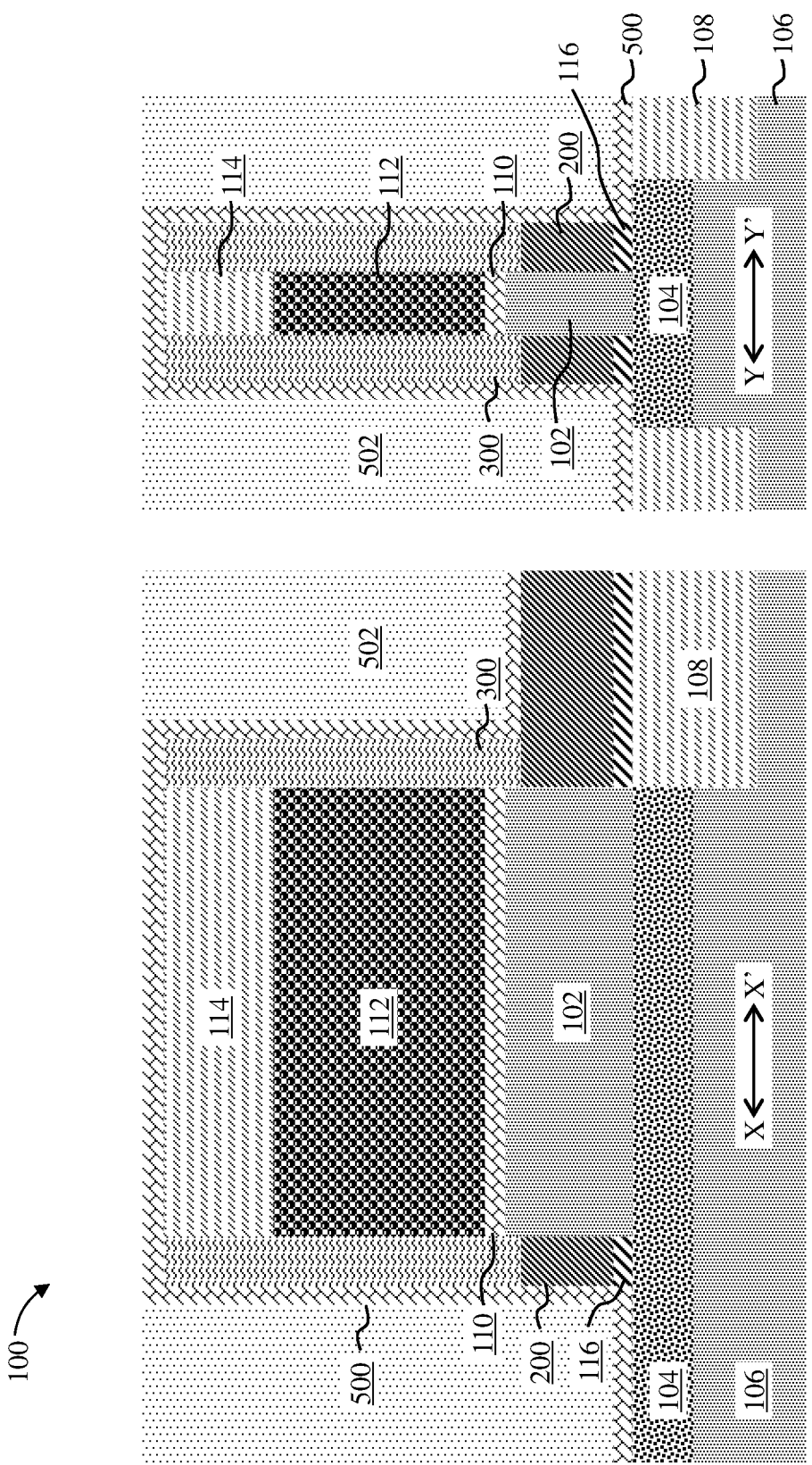
FIG. 5 depicts a cross-sectional view of the semiconductor structure after a processing operation according to one or more embodiments of the invention.
Figure 11:
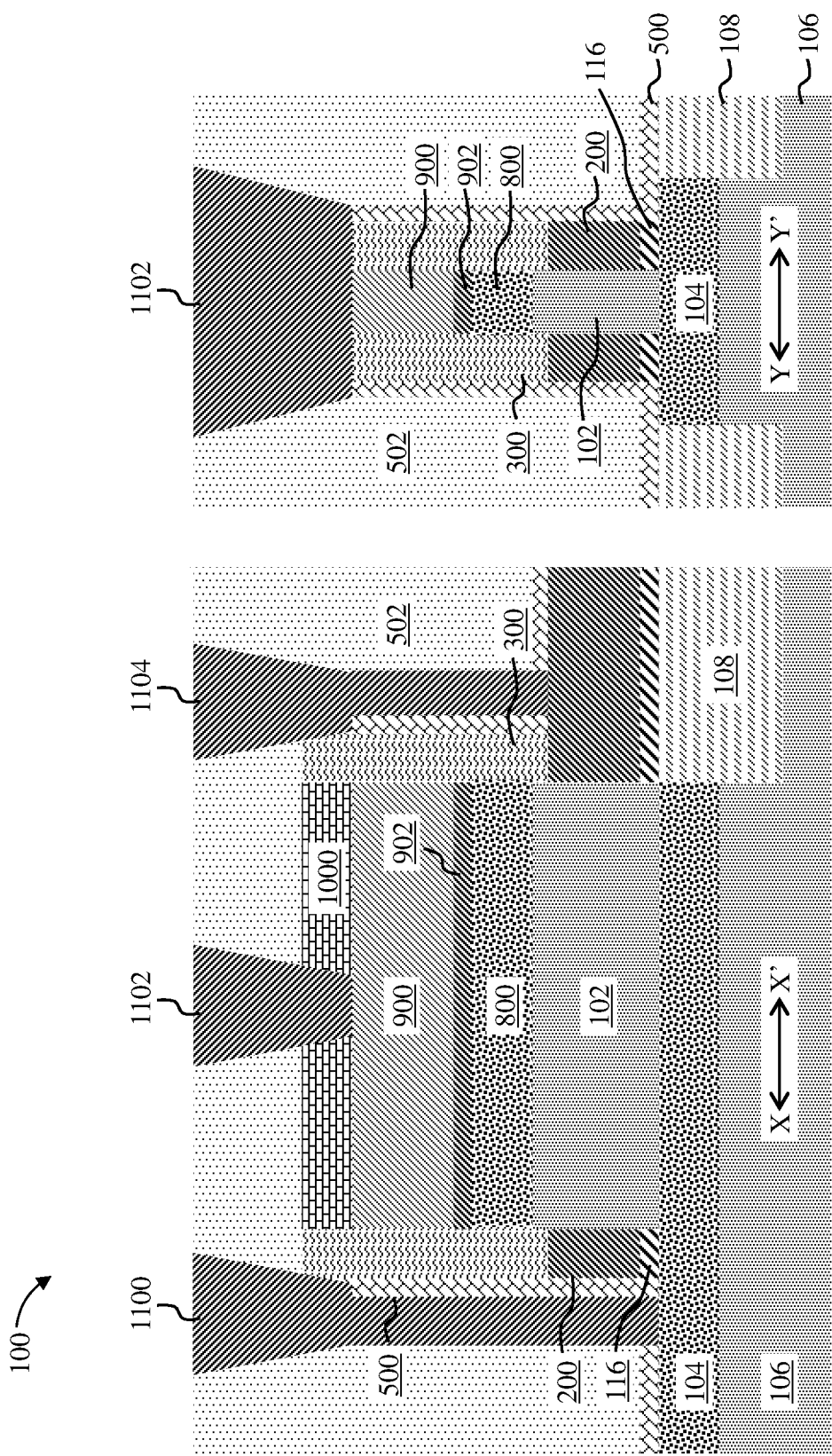
FIG. 11 depicts a cross-sectional view of the semiconductor structure after a processing operation according to one or more embodiments of the invention.

FIG. 5 depicts a cross-sectional view of the VFET structure 100 along X-X' and Y-Y' after forming a liner 500 over the VFET structure 100 and forming an interlayer dielectric (ILD) 502 over the liner 500 during an intermediate operation of the exemplary method of fabricating a semiconductor device according to one or more embodiments of the invention. The liner 500 can include a hard dielectric material such as, for example, a silicon nitride, a carbon containing silicon nitride (SiCN), a boron nitride (BN), a silicon boron nitride (SiBN), and a siliconborocarbonitride (SiBCN). The liner 500 can be formed using any suitable process. In some embodiments of the invention, the liner 500 is conformally deposited using, for example, ALD. In some embodiments of the invention, the liner 500 is conformally formed to a thickness of about 2 nm to about 50 nm, although other thicknesses are within the contemplated scope of the invention. The liner 500 prevents a short (electrical contact) between the conductive gate 200 and the bottom S/D contact 1100 (as depicted in FIG. 11).

The ILD 502 can be any suitable dielectric material, such as, for example, a silicon oxide, and can be formed using any suitable process. In some embodiments of the invention, the ILD 502 is planarized to a surface of the liner 500 using, for example, CMP. In some embodiments of the invention, the CM' can be utilized to remove excess portions of the ILD 502 selective to the liner 500.

FIG. 6 depicts a cross-sectional view of the VFET structure 100 X-X' and Y-Y' after removing the third hard mask 114 during an intermediate operation of the exemplary method of fabricating a semiconductor device according to one or more embodiments of the invention. The third hard mask 114 can be removed using any suitable process, such as, for example, a wet etch, a dry etch, or a combination of sequential wet and/or dry etches. In some embodiments of the invention, a material of the third hard mask 114 is selected such that the etching process is selective to the second hard mask 112.

FIG. 7 depicts a cross-sectional view of the VFET structure 100 along X-X' and Y-Y' after removing the first and second hard masks 110 and 112 during an intermediate operation of the exemplary method of fabricating a semiconductor device according to one or more embodiments of the invention. The first and second hard masks 110 and 112 can be removed using any suitable process, such as, for example, a wet etch, a dry etch, or a combination of sequential wet and/or dry etches. In some embodiments of the invention, a material of the second hard mask 112 is selected such that the etching process is selective to the top spacer 300. In this manner the top spacer 300 is preserved during the removal process. In some embodiments of the invention, the first hard mask 110 is removed using an etch process selective to the semiconductor fins 102 and a top surface of the semiconductor fins 102 is exposed. Removing the first and second hard masks 110 and 112 can result in removing portions of the ILD 502. In some embodiments of the invention, the ILD 502 is recessed about 3 to 5 nm from the liner 500.

Figure 10:
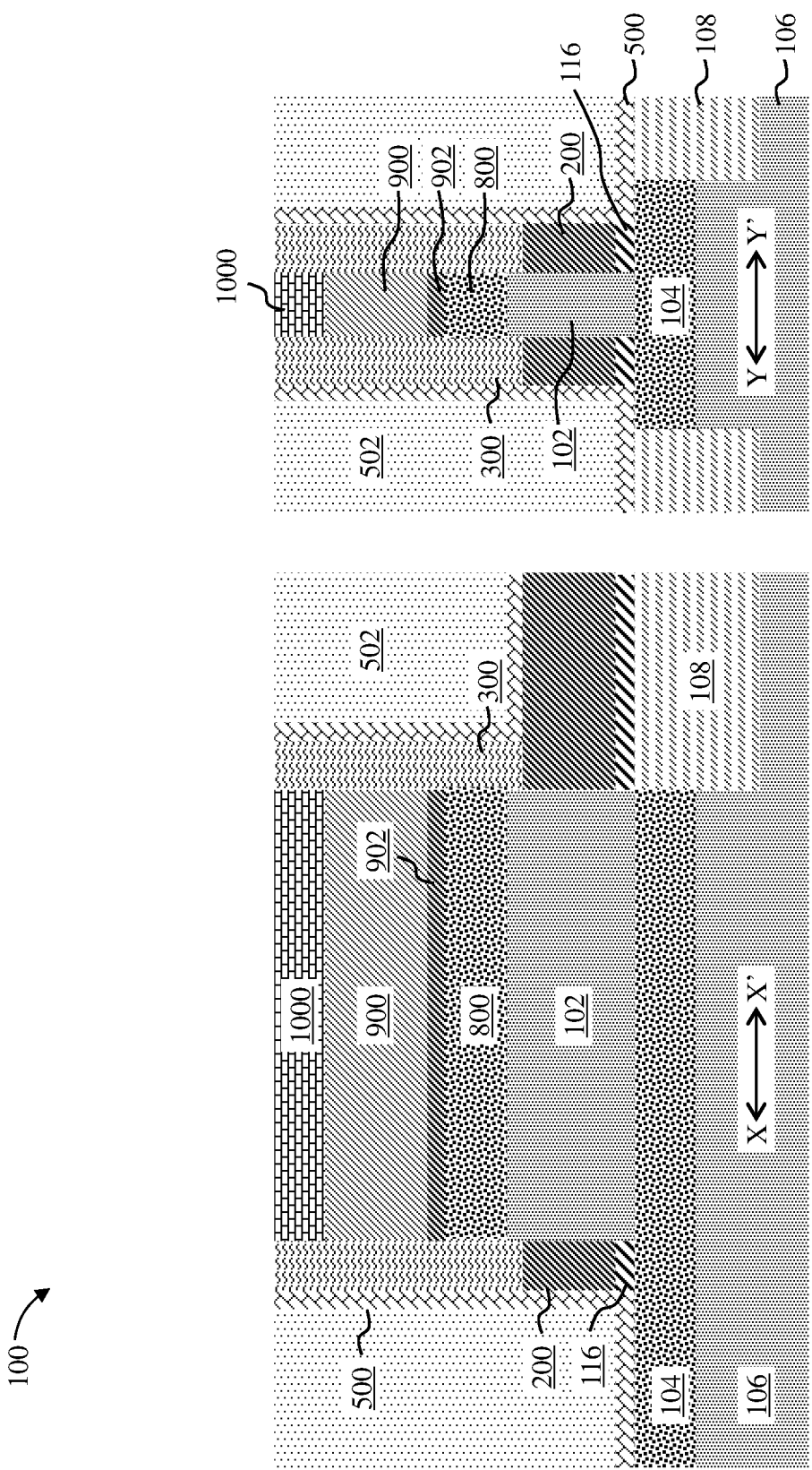
FIG. 10 depicts a cross-sectional view of the semiconductor structure after a processing operation according to one or more embodiments of the invention.

FIG. 8 depicts a cross-sectional view of the VFET structure 100 along X-X' and Y-Y' after forming a top S/D region 800 on the semiconductor fins 102 during an intermediate operation of the exemplary method of fabricating a semiconductor device according to one or more embodiments of the invention. As depicted in FIG. 10, the top S/D region 800 is formed on exposed portions of the semiconductor fins 102. The top S/D region 800 can be an epitaxial silicon layer epitaxially grown using known processes. Epitaxial materials can be grown from gaseous or liquid precursors. In some embodiments of the invention of the invention, the gas source for the deposition of epitaxial semiconductor materials can include a silicon containing gas source, a germanium containing gas source, or a combination thereof. Epitaxial materials can be grown using, for example, VPE, MBE, or LPE. Epitaxial silicon, silicon germanium, and/or carbon doped silicon (Si:C) can be doped during deposition (in-situ doped) by adding n-type dopants (e.g., phosphorus or arsenic) or p-type dopants (e.g., boron or gallium), depending on the type of transistor. The dopant concentration in the top S/D region 800 can range from about $1\times10^{19}$ cm$^{-3}$ to about $2\times10^{21}$ cm$^{-3}$, for example, between about $2\times10^{20}$ cm$^{-3}$ and about $1\times10^{21}$ cm$^{-3}$.

Figure 9:
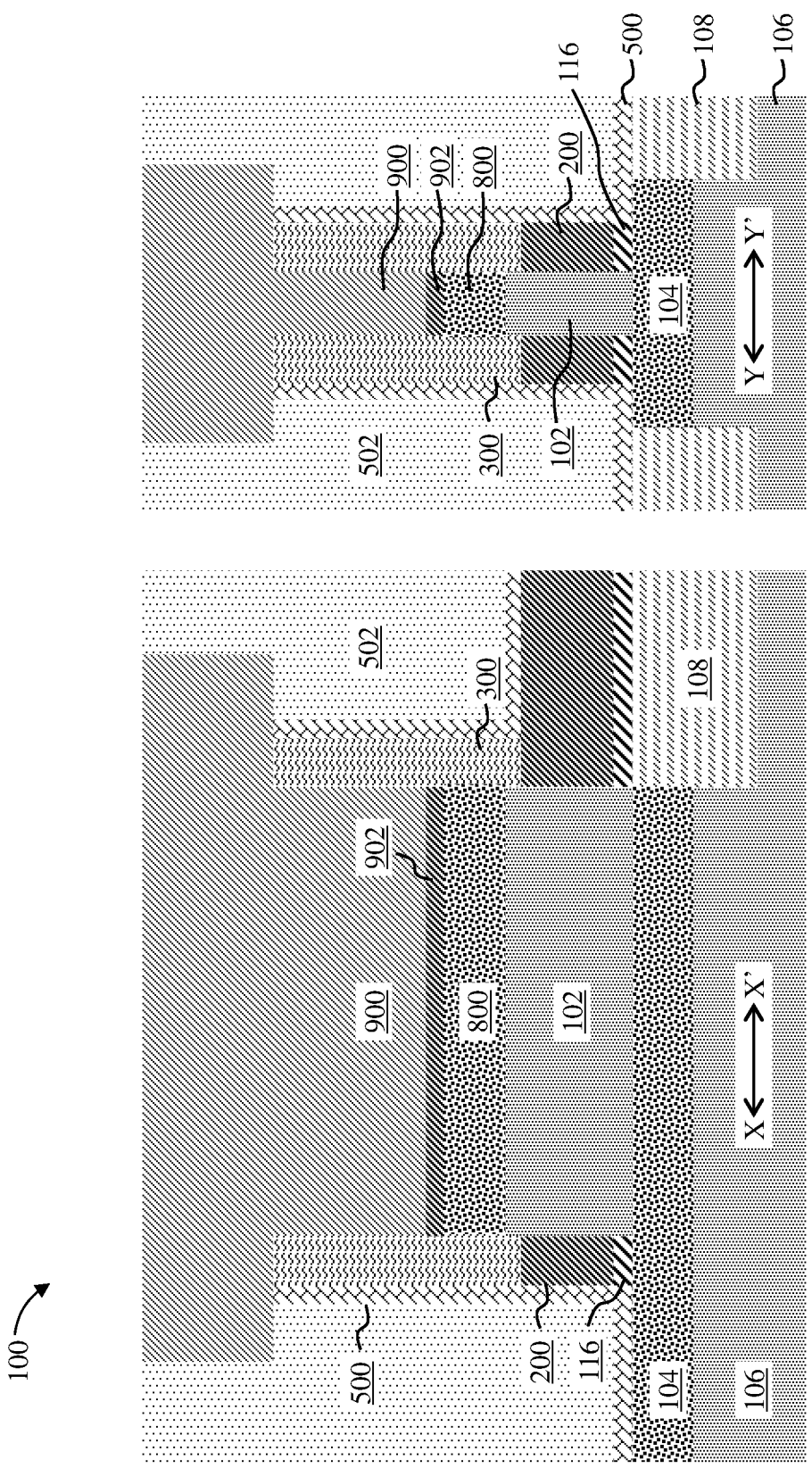
FIG. 9 depicts a cross-sectional view of the semiconductor structure after a processing operation according to one or more embodiments of the invention.

FIG. 9 depicts a cross-sectional view of the VFET structure 100 along X-X' and Y-Y' after forming a top S/D metallization layer 900 during an intermediate operation of the exemplary method of fabricating a semiconductor device according to one or more embodiments of the invention. The top S/D metallization layer 900 can be formed using known metallization techniques. For example, in some embodiments of the invention the top S/D metallization layer 900 is deposited over the top S/D region 800. In some embodiments of the invention, the top S/D metallization layer 900 is planarized using a CMP selective to the ILD 502.

The top S/D metallization layer 900 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the top S/D metallization layer 900 includes a metal (e.g., titanium) that reacts with the top S/D region 800 to form a silicide film 902 between the top S/D region 800 and the top S/D metallization layer 900. As the silicide film 902 is only formed where the top S/D metallization layer 900 contacts the top S/D region 800 the silicide can be said to be self-aligned to the top S/D region 800 (a self-aligned silicide is also referred to as a salicide).

FIG. 10 depicts a cross-sectional view of the VFET structure 100 along X-X' and Y-Y' after recessing the top S/D metallization layer 900 during an intermediate operation of the exemplary method of fabricating a semiconductor device according to one or more embodiments of the invention. The top S/D metallization layer 900 can be recessed using any suitable process, such as, for example, a wet etch, a dry etch, or a combination of sequential wet and/or dry etches. In some embodiments of the invention, the top S/D metallization layer 900 is recessed below a surface of the top spacer 300. In some embodiments of the invention, the top S/D metallization layer 900 is recessed using RIE selective to the top spacer 300.

Figure 12:
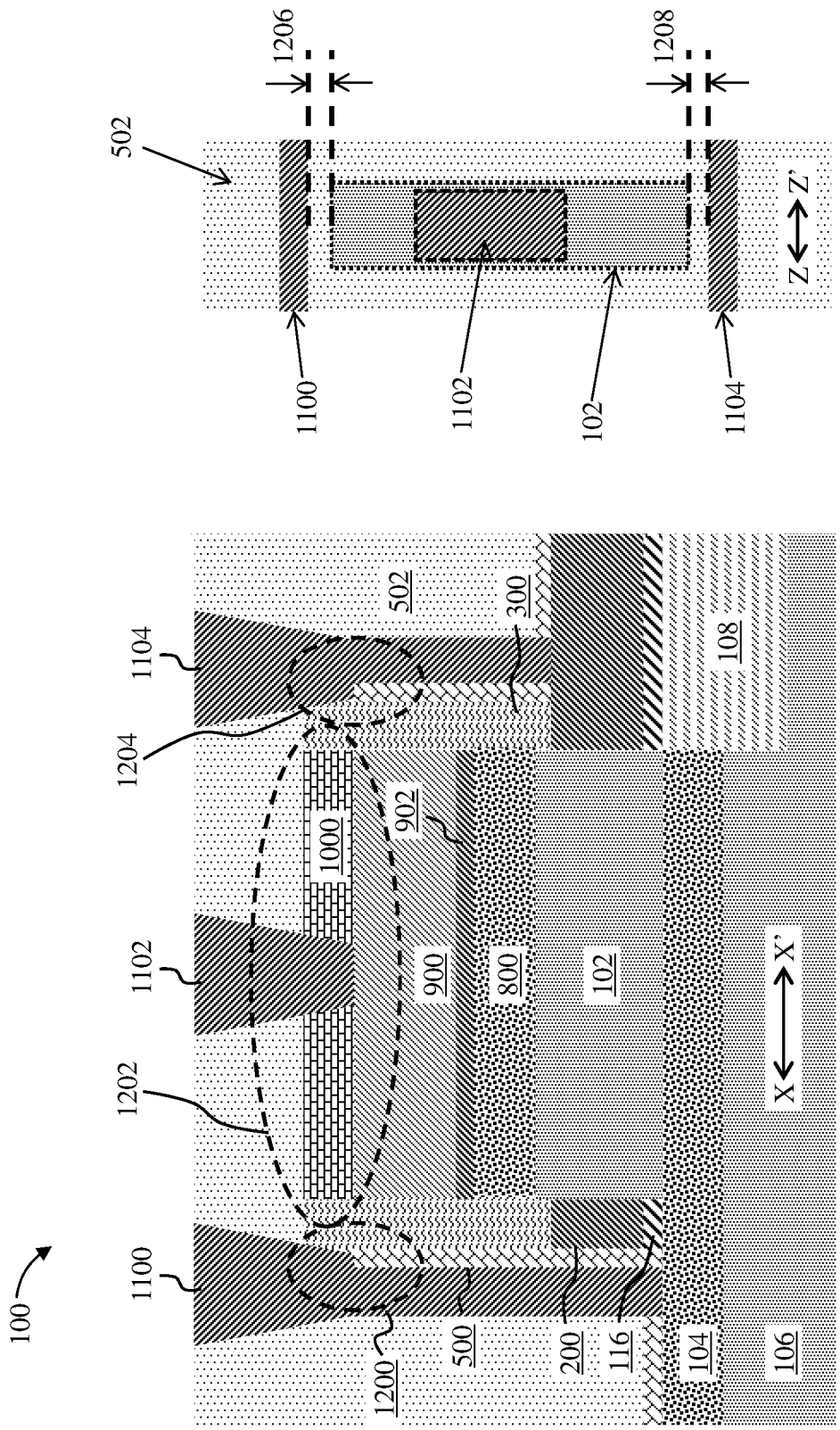
FIG. 12 depicts a cross-sectional view of a semiconductor structure after a processing operation according to one or more embodiments of the invention.

A dielectric cap 1000 is then formed on the recessed surfaced of the top S/D metallization layer 900. In some embodiments of the invention, the dielectric cap 1000 can include a hard dielectric material such as, for example, a silicon nitride, SiCN, BN, SiBN, and SiBCN. In this manner, the dielectric cap 1000 can serve to self-align the bottom S/D contact 1100, the top S/D contact 1102, and the gate contact 1104 (as depicted in FIG. 12). In some embodiments of the invention, the dielectric cap 1000 can include a same material as the top spacer 300. The dielectric cap 1000 can be formed using any suitable process. In some embodiments of the invention, the dielectric cap 1000 is conformally deposited using, for example, ALD. In some embodiments of the invention, the dielectric cap 1000 is formed to a thickness of about 10 nm to about 50 nm, although other thicknesses are within the contemplated scope of the invention.

FIG. 11 depicts a cross-sectional view of the VFET structure 100 along X-X' and Y-Y' after forming a bottom S/D contact 1100, a top S/D contact 1102, and a gate contact 1104 (collectively, the contacts) during an intermediate operation of the exemplary method of fabricating a semiconductor device according to one or more embodiments of the invention. The contacts 1100, 1102, and 1104 can be formed using known metallization techniques. In some embodiments of the invention the thickness of the ILD 502 is increased by depositing additional dielectric material prior to forming the contacts 1100, 1102, and 1104. The ILD 502 can then be patterned into open trenches (not depicted) using known processes, such as a wet or dry etch. In some embodiments of the invention, the contacts 1100, 1102, and 1104 are overfilled into the trenches, forming overburdens above a surface of the ILD 502. In some embodiments of the invention, a CMP removes the overburden. In some embodiments of the invention, the trenches are patterned selective to the dielectric cap 1000, the top spacer 300, and/or the liner 500. In this manner, contact trench misalignments are prevented. In other words, the contacts 1100, 1102, and 1104 can be self-aligned to the dielectric cap 1000, the top spacer 300, and/or the liner 500.

The bottom S/D contact 1100, top S/D contact 1102, and gate contact 1104 can be made of any suitable conducting material, such as, for example, metal (e.g., tungsten, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the contacts 1100, 1102, and 1104 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

FIG. 12 depicts a cross-sectional view of the VFET structure 100 along X-X' and a direction Z-Z' (top-down direction) after forming the contacts 1100, 1102, and 1104 during an intermediate operation of the exemplary method of fabricating a semiconductor device according to one or more embodiments of the invention. As discussed previously herein, the contacts 1101, 1102, and 1104 are confined and aligned by the dielectric cap 1000, the liner 500, and the top spacer 300. In other words, the contacts 1100, 1102, and 1104 are self-aligned to alignment features 1200, 1202, and 1204, respectively.

The alignment features 1200, 1202, and 1204 provide several advantages over conventional VFETs. As discussed previously herein, conventional VFETs require the bottom S/D contact and gate contact to be formed far away from the fin to prevent shorting. The bottom S/D contact 1100, however, is prevented from shorting to the conductive gate 200 or the top S/D metallization layer 900 by the alignment feature 1200. Similarly, the gate contact 1104 is prevented from shorting to the top S/D metallization layer 900 by the alignment feature 1204. Consequently, conventional VFET spacing requirements can be relaxed and the bottom S/D contact-to-fin spacing 1206 and gate contact-to-fin spacing 1208 can be reduced. Moreover, while conventional VFETs require a relatively large top S/D contact formed over the entire length of the semiconductor fin, the alignment feature 1202 allows for the top S/D contact 1102 to be significantly reduced in size. Specifically, the top S/D contact 1102 can be smaller than the semiconductor fin 102. In other words, the top S/D contact 1102 can be formed over a portion of the semiconductor fin 102 (i.e., the top S/D contact 1102 can have a via like structure as depicted in FIG. 12).

Figure 13:
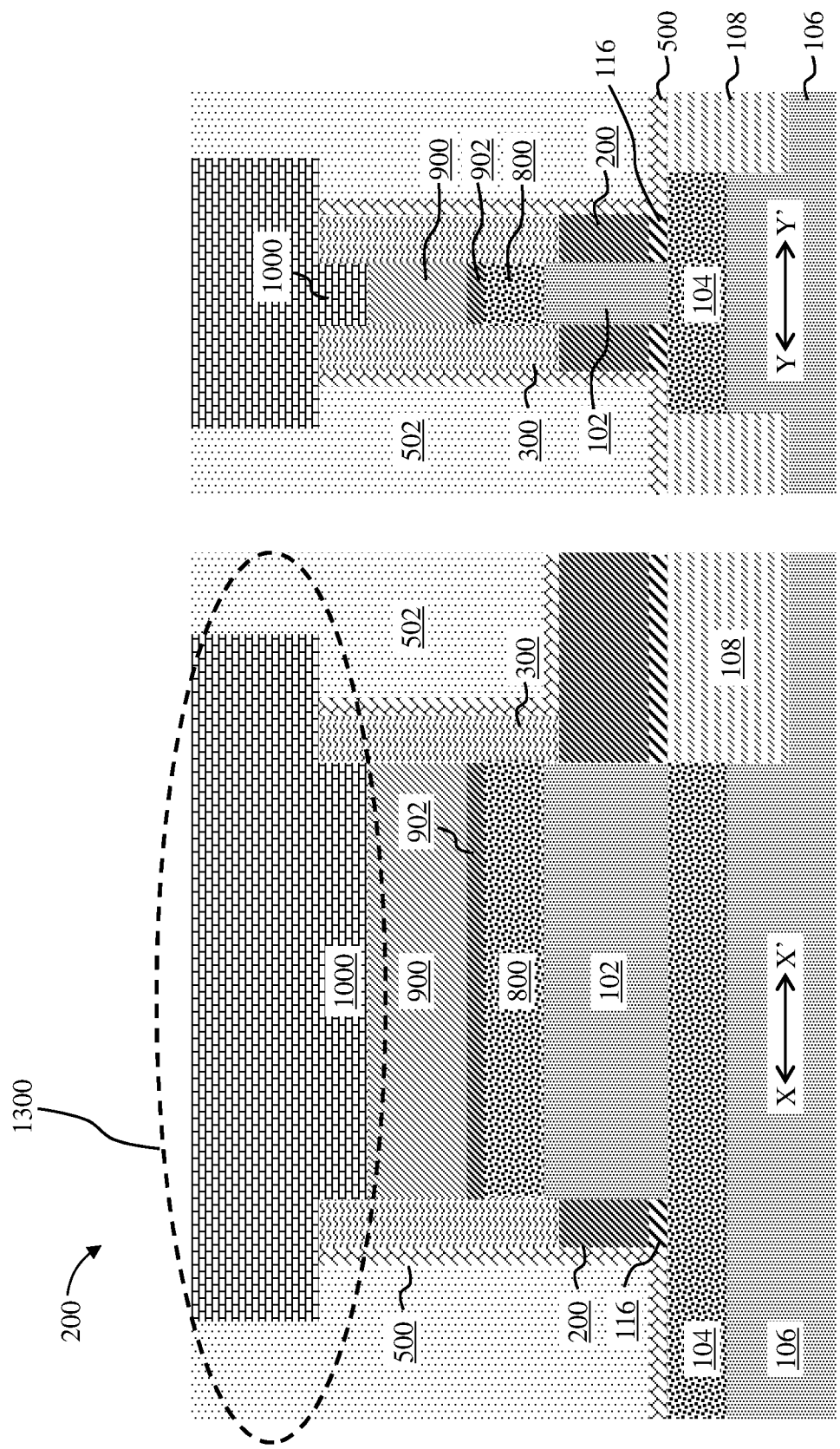
FIG. 13 depicts a cross-sectional view of a semiconductor structure after a processing operation according to one or more embodiments of the invention.

FIG. 13 depicts a cross-sectional view of a VFET structure 200 along X-X' and Y-Y' after recessing the top S/D metallization layer 900 during an intermediate operation of the exemplary method of fabricating a semiconductor device according to one or more embodiments of the invention. As discussed previously herein, the top S/D metallization layer 900 can be recessed using any suitable process, such as, for example, a wet etch, a dry etch, or a combination of sequential wet and/or dry etches. In some embodiments of the invention, the top S/D metallization layer 900 is recessed below a surface of the top spacer 300. In some embodiments of the invention, the top S/D metallization layer 900 is recessed using RIE selective to the top spacer 300.

Figure 15:
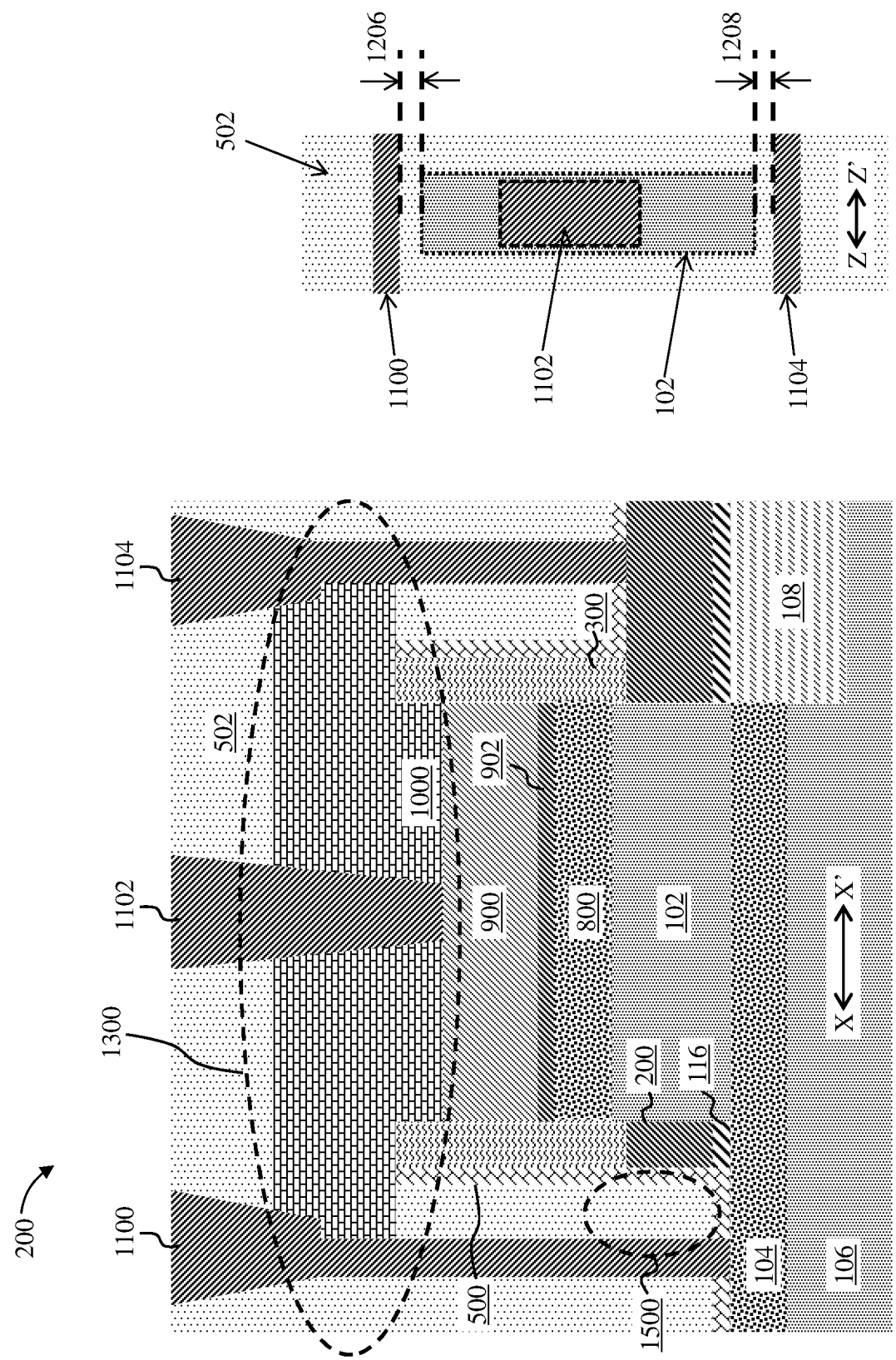
FIG. 15 depicts a cross-sectional view of the semiconductor structure after a processing operation according to one or more embodiments of the invention.

In some embodiments of the present invention, the dielectric cap 1000 is formed on the recessed surfaced of the top S/D metallization layer 900 and over portions of the top spacer 300, the liner 500, and the ILD 502 (defining, i.e., a T-shaped dielectric region 1300). The T-shaped dielectric region 1300 provides additional insurance against a short between the bottom S/D contact 1100 and the conductive gate 200, especially in cases where the liner 500 is not thick enough to guarantee separation (as depicted in FIG. 15).

In some embodiments of the invention, the dielectric cap 1000 can include a hard dielectric material such as, for example, a silicon nitride, SiCN, BN, SiBN, and SiBCN. In this manner, the dielectric cap 1000 can serve to self-align the bottom S/D contact 1100, the top S/D contact 1102, and the gate contact 1104 (as depicted in FIG. 15). In some embodiments of the invention, the dielectric cap 1000 can include a same material as the top spacer 300. The dielectric cap 1000 can be formed using any suitable process. In some embodiments of the invention, the dielectric cap 1000 is conformally deposited using, for example, ALD. In some embodiments of the invention, the dielectric cap 1000 is formed to a thickness of about 10 nm to about 200 nm, although other thicknesses are within the contemplated scope of the invention.

Figure 14:
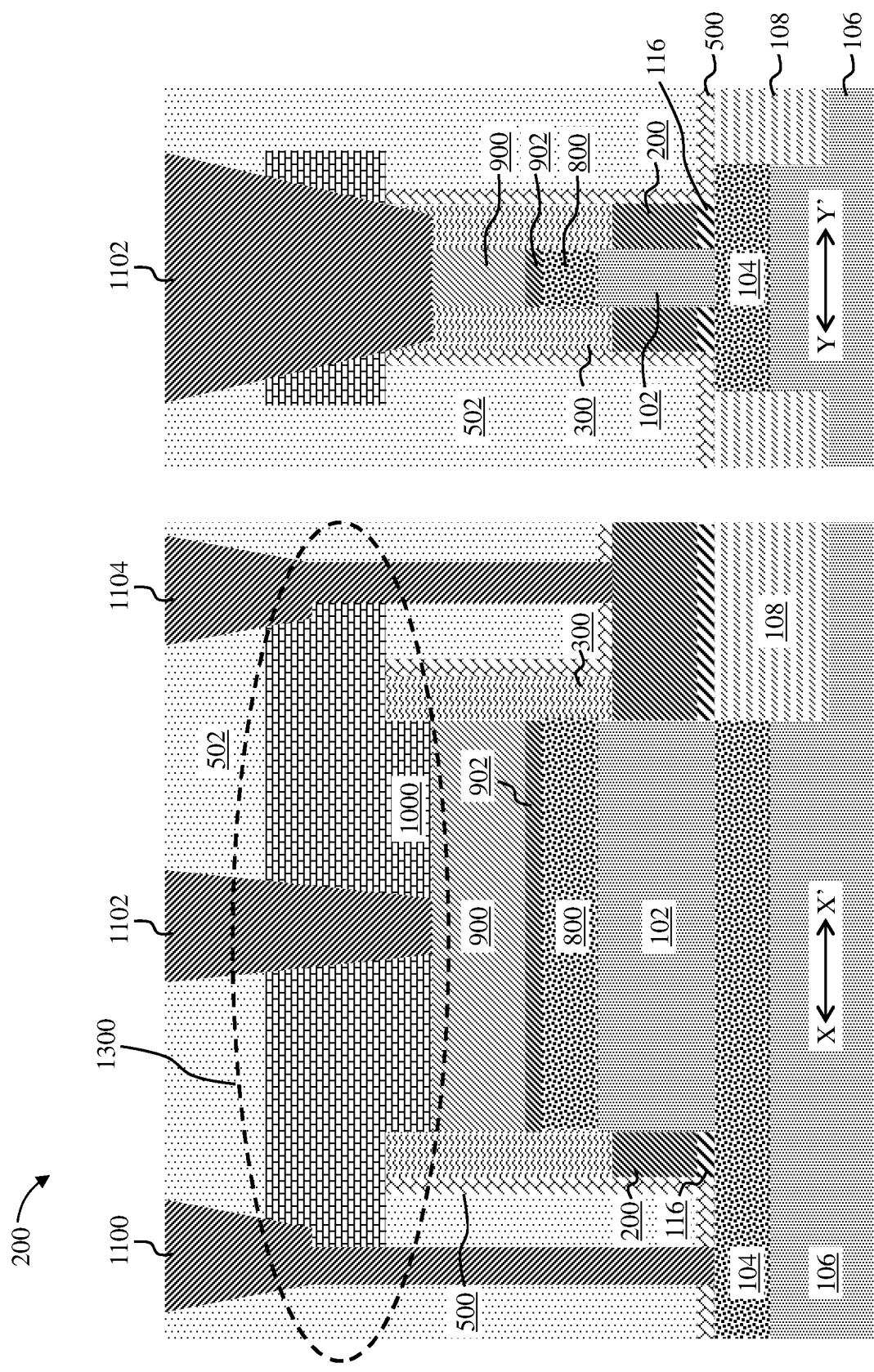
FIG. 14 depicts a cross-sectional view of the semiconductor structure after a processing operation according to one or more embodiments of the invention.

FIG. 14 depicts a cross-sectional view of the VFET structure 200 along X-X' and Y-Y' after forming a bottom S/D contact 1100, a top S/D contact 1102, and a gate contact 1104 (collectively, the contacts) during an intermediate operation of the exemplary method of fabricating a semiconductor device according to one or more embodiments of the invention. The contacts 1100, 1102, and 1104 can be formed using known metallization techniques. In some embodiments of the invention the thickness of the ILD 502 is increased by depositing additional dielectric material prior to forming the contacts 1100, 1102, and 1104. The ILD 502 can then be patterned into open trenches (not depicted) using known processes, such as a wet or dry etch. In some embodiments of the invention, the contacts 1100, 1102, and 1104 are overfilled into the trenches, forming overburdens above a surface of the ILD 502. In some embodiments of the invention, a CMP removes the overburden. In some embodiments of the invention, the trenches are patterned selective to the dielectric cap 1000, the top spacer 300, and/or the liner 500. In this manner, contact trench misalignments are prevented. In other words, the contacts 1100, 1102, and 1104 can be self-aligned to the dielectric cap 1000, the top spacer 300, and/or the liner 500.

The bottom S/D contact 1100, top S/D contact 1102, and gate contact 1104 can be made of any suitable conducting material, such as, for example, metal (e.g., tungsten, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the contacts 1100, 1102, and 1104 can be copper and can include a barrier metal liner (not depicted). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

FIG. 15 depicts a cross-sectional view of the VFET structure 200 along X-X' and Z-Z' after forming the contacts 1100, 1102, and 1104 during an intermediate operation of the exemplary method of fabricating a semiconductor device according to one or more embodiments of the invention. As discussed previously herein, the T-shaped dielectric region 1300 provides additional insurance against a short between the bottom S/D contact 1100 and the conductive gate 200. The T-shaped dielectric region 1300 extends into the ILD 502. Consequently, a buffer region 1500 is formed between the bottom S/D contact 1100 and the conductive gate 200. The buffer region 1500 includes a same dielectric material as the ILD 502.

The T-shaped dielectric region 1300 and the buffer region 1500 advantageously provide several advantages over conventional VFETs, in a similar manner as the alignment features 1200, 1202, and 1204 (depicted in FIG. 12). As discussed previously herein, conventional VFETs require the bottom S/D contact and gate contact to be formed far away from the fin to prevent shorting. The bottom S/D contact 1100, however, is prevented from shorting to the conductive gate 200 by the buffer region 1500. The gate contact 1104 is prevented from shorting to the top S/D metallization layer 900 by the T-shaped dielectric region 1300. Consequently, conventional VFET spacing requirements can be relaxed and the bottom S/D contact-to-fin spacing 1206 and gate contact-to-fin spacing 1208 can be reduced. Moreover, while conventional VFETs require a relatively large top S/D contact formed over the entire length of the semiconductor fin, the T-shaped dielectric region 1300 allows for the top S/D contact 1102 to be significantly reduced in size. Specifically, the top S/D contact 1102 can be smaller than the semiconductor fin 102. In other words, the top S/D contact 1102 can be formed over a portion of the semiconductor fin 102 (i.e., the top S/D contact 1102 can have a via like structure as depicted in FIG. 15).

Figure 16:
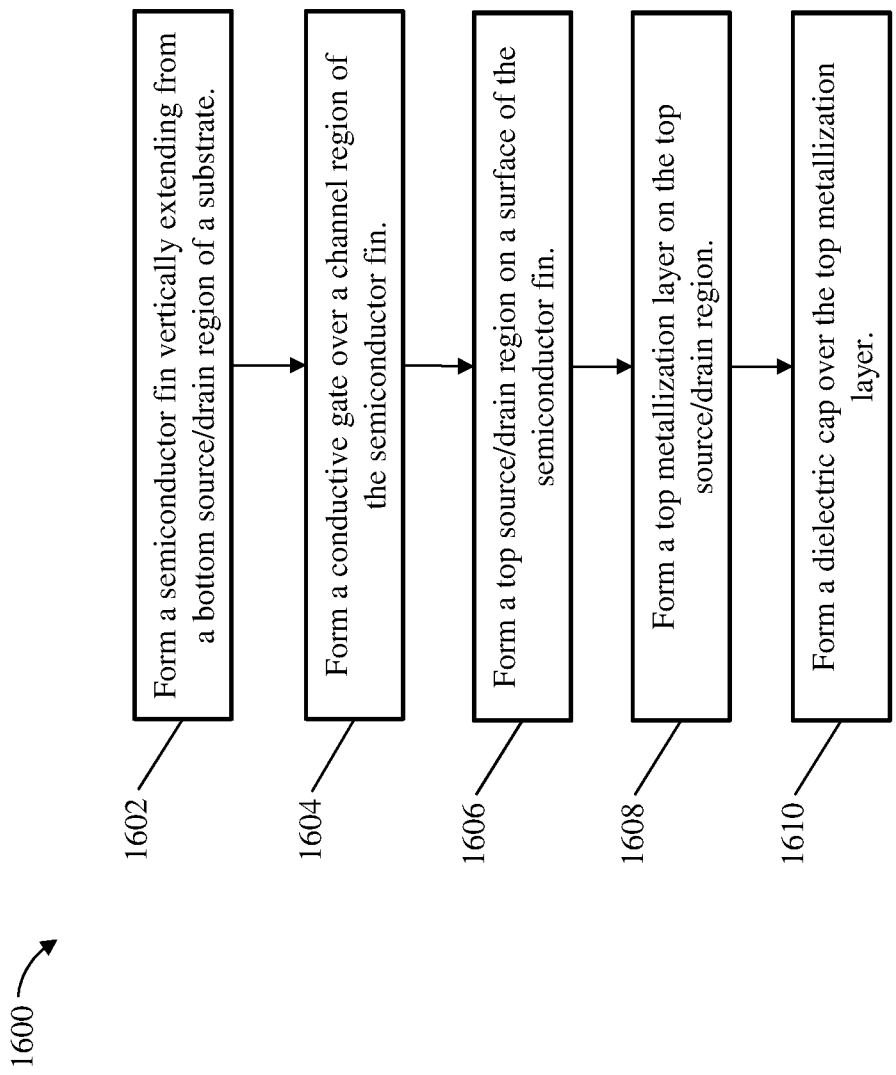
FIG. 16 depicts a flow diagram illustrating a method according to one or more embodiments of the invention.

FIG. 16 depicts a flow diagram 1600 illustrating a method for forming a semiconductor device according to one or more embodiments of the invention. As shown at block 1602, a semiconductor fin is formed vertically extending from a bottom source/drain region of a substrate. The semiconductor fin can be formed in a similar manner as the semiconductor fins 102 (as depicted in FIG. 1) according to one or more embodiments.

As shown at block 1604, a conductive gate is formed over a channel region of the semiconductor fin. The conductive gate can be formed in a similar manner as the conductive gate 200 (as depicted in FIG. 2) according to one or more embodiments.

As shown at block 1606, a top source/drain region is formed on a surface of the semiconductor fin. The top source/drain region can be formed in a similar manner as the top S/D region 800 (as depicted in FIG. 8) according to one or more embodiments.

As shown at block 1608, a top metallization layer is formed on the top source/drain region. The top metallization layer can be formed in a similar manner as the top S/D metallization layer 900 (as depicted in FIG. 9) according to one or more embodiments.

As shown at block 1610, a dielectric cap is formed over the top metallization layer. The dielectric cap can be formed in a similar manner as the dielectric cap 1000 (as depicted in FIG. 10) according to one or more embodiments. In some embodiments of the invention, the dielectric cap 1000 is formed on the recessed surfaced of the top S/D metallization layer 900 and over portions of the top spacer 300, the liner 500, and the ILD 502 and defines a T-shaped dielectric region 1300 (as depicted in FIG. 13).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and can not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a semiconductor fin vertically extending from a bottom source/drain region of a substrate;
   a conductive gate formed over a channel region of the semiconductor fin;
   a top source/drain region on a surface of the semiconductor fin;
   a top metallization layer on the top source/drain region;
   a dielectric cap over the top metallization layer; and
   a bottom source/drain contact over the dielectric cap and on a portion of the bottom source/drain region, wherein a portion of the dielectric cap is between the bottom source/drain contact and the top metallization layer.

2. The semiconductor device of claim 1 further comprising a gate contact formed over the dielectric cap and on a portion of the conductive gate, wherein a portion of the dielectric cap is between the gate contact and the top metallization layer.

3. The semiconductor device of claim 1 further comprising a gate contact formed through a portion of the dielectric cap and on a surface of the top metallization layer.

4. The semiconductor device of claim 1, wherein the dielectric cap comprises a dielectric material selected from the group consisting of a silicon nitride, SiCN, BN, SiBN, SiBCN, and combinations thereof.

5. A semiconductor device comprising:
   a semiconductor fin vertically extending from a bottom source/drain region of a substrate;
   a conductive gate formed over a channel region of the semiconductor fin;
   a top source/drain region on a surface of the semiconductor fin;
   a top metallization layer on the top source/drain region;
   a dielectric cap over the top metallization layer; and
   a gate contact formed over the dielectric cap and on a portion of the conductive gate, wherein a portion of the dielectric cap is between the gate contact and the top metallization layer.

6. The semiconductor device of claim 5 further comprising a bottom source/drain contact formed over the dielectric cap and on a portion of the bottom source/drain region, wherein a portion of the dielectric cap is between the bottom source/drain contact and the top metallization layer.

7. The semiconductor device of claim 5 further comprising a gate contact formed through a portion of the dielectric cap and on a surface of the top metallization layer.

8. The semiconductor device of claim 5, wherein the dielectric cap comprises a dielectric material selected from the group consisting of a silicon nitride, SiCN, BN, SiBN, SiBCN, and combinations thereof.

* * * * *